(12) United States Patent
Gardose et al.

(10) Patent No.: US 10,854,474 B2
(45) Date of Patent: Dec. 1, 2020

(54) PRE-CUT PLATING LINES ON LEAD FRAMES AND LAMINATE SUBSTRATES FOR SAW SINGULATION

(71) Applicant: Texas Instruments Incorporated, Dallas, TX (US)

(72) Inventors: Erma Gallenero Gardose, Baguio (PH); Liya Flores Aquino, Baguio (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/842,376

(22) Filed: Apr. 7, 2020

(65) Prior Publication Data

US 2020/0234975 A1    Jul. 23, 2020

Related U.S. Application Data

(62) Division of application No. 16/002,963, filed on Jun. 7, 2018, now Pat. No. 10,615,053.

(51) Int. Cl.
*H01L 21/48* (2006.01)
*H01L 23/495* (2006.01)

(52) U.S. Cl.
CPC ...... *H01L 21/4842* (2013.01); *H01L 21/4825* (2013.01); *H01L 21/4828* (2013.01); *H01L 23/4952* (2013.01); *H01L 23/49503* (2013.01); *H01L 23/49537* (2013.01)

(58) Field of Classification Search
CPC ............. H01L 21/4842; H01L 21/4825; H01L 21/4828; H01L 23/49503; H01L 23/4952; H01L 23/49537
See application file for complete search history.

(56) References Cited

U.S. PATENT DOCUMENTS

| | | | |
|---|---|---|---|
| 2005/0124148 A1* | 6/2005 | Tuominen | H05K 1/185 438/618 |
| 2008/0261338 A1* | 10/2008 | Ilhola | H01L 24/24 438/26 |

* cited by examiner

*Primary Examiner* — Marc Anthony Armand
(74) *Attorney, Agent, or Firm* — Dawn Jos; Charles A. Brill; Frank D. Cimino

(57) ABSTRACT

Described herein is a technology or a method for pre-fabricating pre-cut plating lines on a lead frame with use of a pre-cut etchback process to minimize burrs during a semiconductor package singulation process. A package includes: a chip, and a lead frame that mounts the chip. The lead frame further includes pre-fabricated pre-cut plating lines that are etched back on the lead frame to form an opening slot on a periphery of the lead frame. The opening slot allows a saw blade to cut through a prepreg material, without touching or cutting a conductive material of the lead frame.

17 Claims, 7 Drawing Sheets

PRE-CUT PLATING LINES ON LEAD FRAMES AND LAMINATE SUBSTRATES FOR SAW SINGULATION

This application is a divisional of U.S. patent application Ser. No. 16/002,963, filed Jun. 7, 2019, the contents of which are herein incorporated by reference in its entirety.

BACKGROUND

A semiconductor package is a metal, plastic, glass or a ceramic casing that includes electronic components. Individual discrete electronic components are etched in a silicon wafer. The process of assembling a semiconductor package includes cutting a wafer and assembling the wafer in a semiconductor package. The semiconductor package provides component and circuit protection against exposure to extreme temperatures and against impact and corrosion. The semiconductor package also holds contact pins or leads.

BRIEF DESCRIPTION OF THE DRAWINGS

The detailed description is described with reference to accompanying figures. In the figures, the left-most digit(s) of a reference number identifies the figure in which the reference number first appears. The same numbers are used throughout the drawings to reference like features and components.

DETAILED DESCRIPTION

Described herein is a technology or a method for fabricating pre-cut plating lines using a pre-cut etchback process in order to minimize burrs during a semiconductor package singulation process. Plating lines are lines, such as copper lines, that are used for electroplating. Prior to an assembly process, plating lines are precut using an etch back process. For example, a chip is mounted on a lead frame. Pre-cut plating lines are etched back on the lead frame (or laminate substrate) during fabrication of the lead frame and prior to mounting of the chip.

In an embodiment, the pre-cut plating lines form an elongated opening slot on a periphery of the lead frame. The elongated opening slot forms a "U" shape. A bottom of the formed "U" shaped opening slot includes an exposed surface of a prepreg material. In certain implementations, prepreg or pre-impregnated material is a glass fiber impregnated with resin used to stick a core and copper foil together in a laminate substrate fabrication. During chip singulation, through use of a saw blade, the saw blade is aligned onto the formed "U" shape without touching or cutting an etched back copper portion of the lead frame. The copper portion includes copper plating lines of the lead frame. The saw blade cuts through the prepreg material without touching the copper plating lines of the lead frame, and minimizing burrs.

Figure 1:
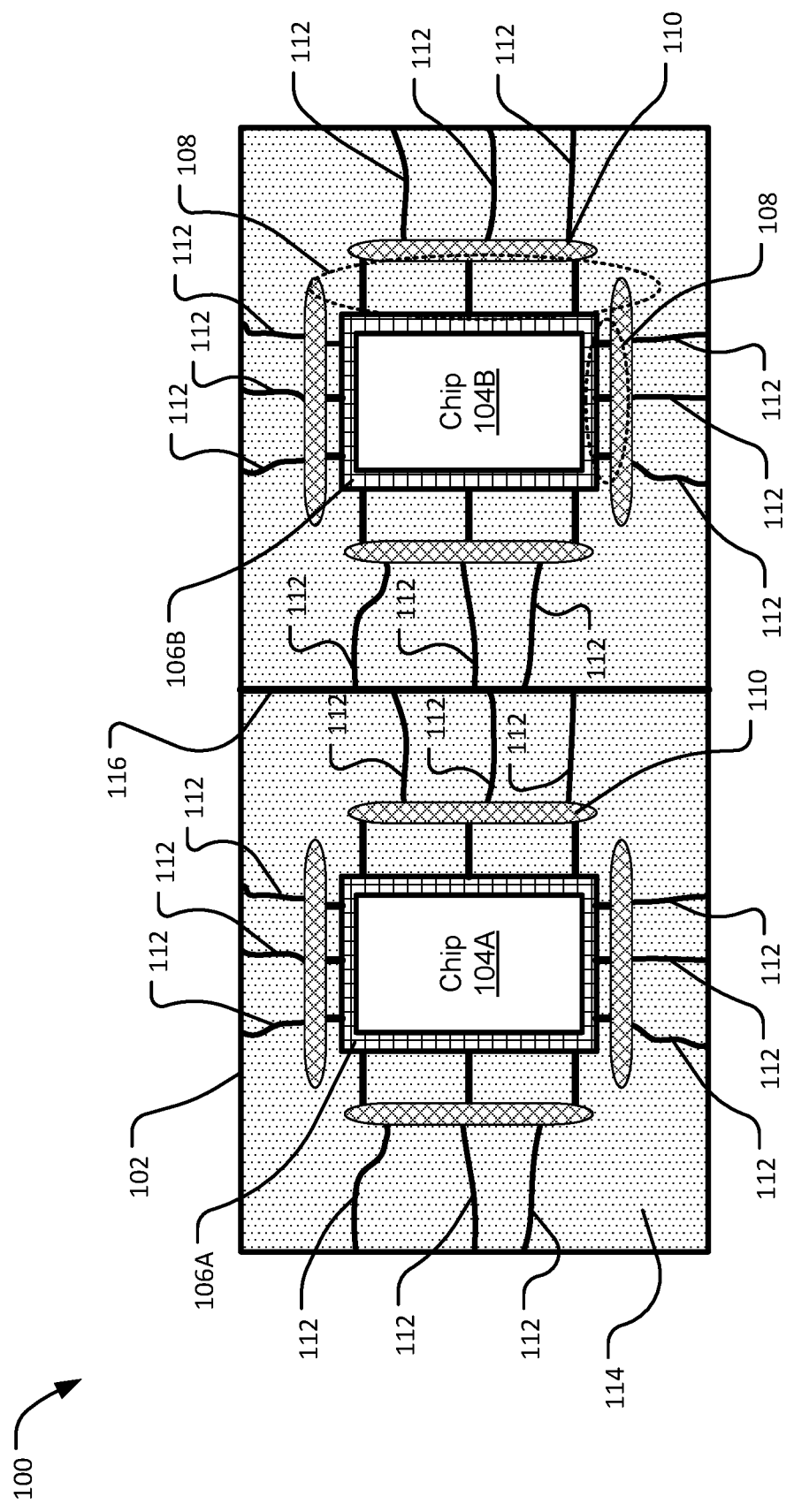
FIG. 1 illustrates an example semiconductor package that implements pre-cut plating lines to minimize burrs as described herein.

FIG. 1 is an example semiconductor package 100 (or device) that implements pre-cut plating lines to minimize burrs as described herein. The pre-cut plating lines are formed on a lead frame (or also called laminate substrate) through an additional semiconductor fabrication step of etching back an opening slot or a cavity on the lead frame. In this example, the etched back opening slot or cavity facilitates minimization of burrs (i.e., burrs in copper) during chip singulation.

As depicted, the package 100 includes a lead frame 102, and a plurality of semiconductor chips (or dies) 104A-104B. The first chip 104A sits on a first copper mounting material 106A, while the second chip 104B sits on a second copper mounting material 106B. The package 100 further shows bonding wires 108 that connect the chips 104 to multiple leads 110.

Furthermore still, plating lines 112 are patterned on the lead frame 102 to connect or extend electrical connections of the bonding wires 108 towards edges of the lead frame 102. The patterned plating lines 112 and lead 110 include a layer of conductive materials such as copper materials that are laminated on top of an insulating material 114. The additional etchback process as described herein includes pre-fabrication of a pre-cut plating line or a trench that traverses the plating lines 112 prior to chip singulation. As shown, the plating lines 112 and the bonding wires 108 are illustrated to include simple configurations for purposes of describing the implementations herein.

The package 100, for example, is a Quad Flat No-leads (QFN) package, a plastic ball grid array (PBGA), or a land grid array (LGA) package that is ready for singulation with a dicing device in order to separate the chip 104A from the chip 104B. The QFN package, the PGBA, and/or LGA package physically and electrically connects the chips 104A and 104B to the lead frame 102 through a surface-mount technology. In other words, the chips 104 are connected to surfaces of the lead frame 102 without use of through-holes.

The dicing device can include a rotating blade that is configured to cut through a singulation line 116 to form a first package and second package. These packages include the first chip 104A and second chip 104B. During the process of separating the packages, burrs or copper burrs from the plating lines 112 along the singulation line 116 can affect performance of the package. Burrs are deformations of metals, such as the copper that is implemented, resulting in undesired metal that causes shorting to the adjacent metal (i.e. copper) during the singulation process. Similarly, copper burrs from other edges of the lead frame 102 can result due to singulation of the other sides or edges of the lead frame 102.

Copper burrs from the cut portions of the plating lines 112 on each side of the singulated package can provide an undesired short circuit to the first chip 104A or second chip 104B. In this example, pre-cut plating lines (not shown) using pre-cut etchback process are formed and disposed on a periphery of the first and second packages in order minimize or avoid presence of the undesired copper burrs during singulation of the lead frame 102 to form separate packages.

In an embodiment, the lead frame 102 is made of a copper material that has been plated with solder, AuNi or palladium. These copper materials are laminated onto the insulating material 114 and thereafter, the copper materials are patterned to form the plating lines 112 and the lead 110. For example, the lead 110 include electrodes or conductive tracks that are laminated to the insulating material 114. In this example, the leads 110 interconnect the bonding wires 108 and the plating lines 112.

Similarly, the copper mounting materials 106 are formed to provide mechanical and electrical support to the chips 104. These copper mounting materials 106 further provides structural protection to the chips 104 during the singulation process.

Figure 2:
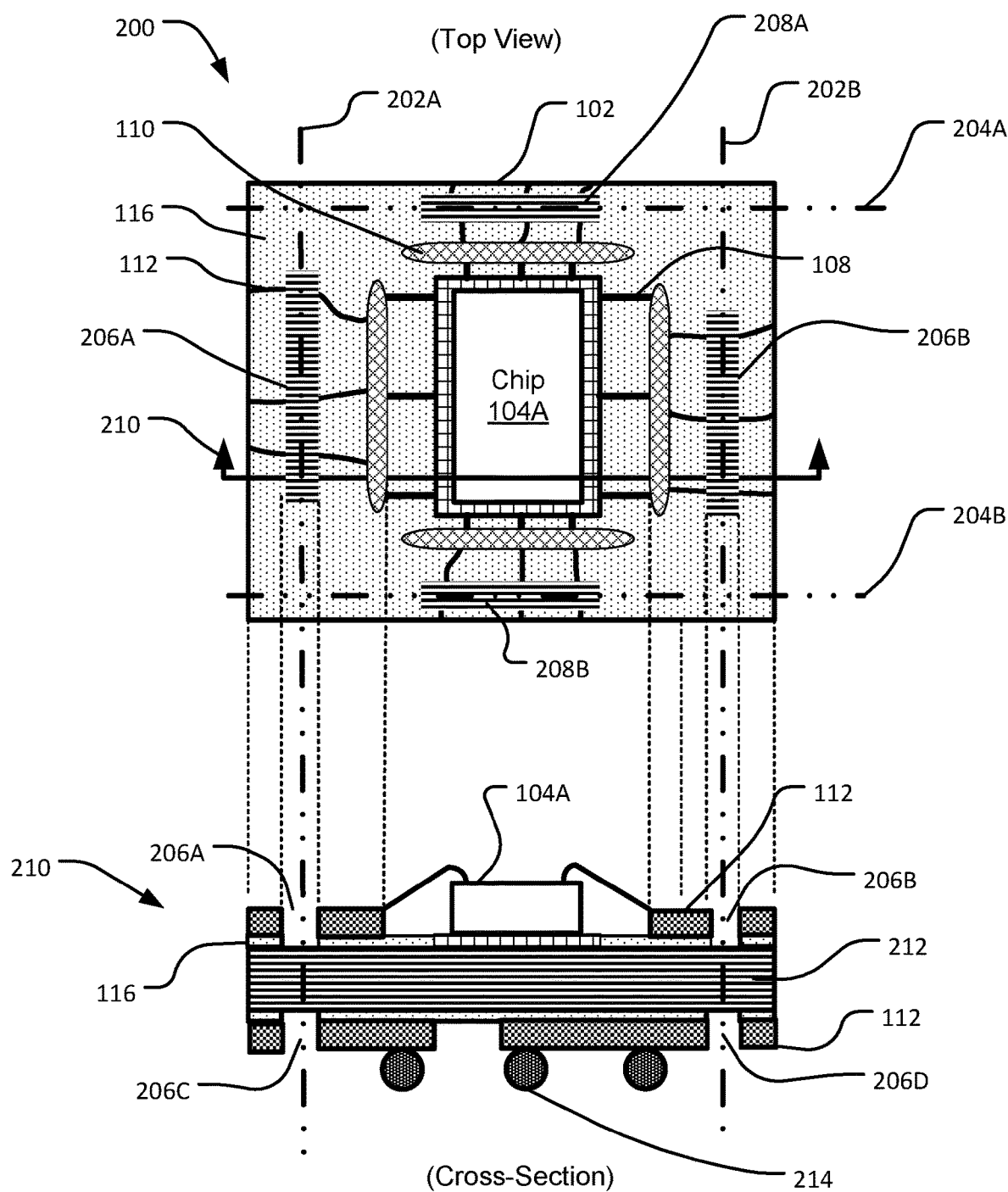
FIG. 2 illustrates an example of a semiconductor package with etched back pre-cut plating lines to minimize burrs as described herein.

FIG. 2 is an example semiconductor package 200 with etched back pre-cut plating lines to minimize burrs as described herein. The semiconductor package 200 is a package with different layers as shown.

As depicted, a top view of the semiconductor package 200 includes the first chip 104A, the copper mounting material 106A, bonding wires 108, the plating lines 112 that extend from the lead 110 to outer perimeter or periphery of the lead frame 102, vertical singulation lines 202A and 202B, and horizontal singulation lines 204A and 204B. Furthermore, the top view includes etched back vertical pre-cut plating lines 206A and 206B, etched back horizontal pre-cut plating lines 208A-208B, and a cross-section 210. The cross-section 210 (below the top view) further illustrates additional components and configurations of the semiconductor package 200.

In an embodiment, each of the vertical pre-cut plating lines 206 includes etched longitudinal opening slot that aligns with the corresponding vertical singulation line 202. The vertical singulation line 202A is disposed along a longitudinal center line of the etched back vertical pre-cut plating line 206A. In this example, the etched back vertical pre-cut plating line 206A includes a "U" shaped opening slot or trench cross-section on a periphery of the lead frame 102. The periphery can be near or along the edges of the lead frame 102. Furthermore, the etched back vertical pre-cut plating line 206A includes a length sufficient to traverse or cut across all plating lines 112 along the side of the lead frame 102 where the etched back vertical pre-cut plating line 206A is located.

Similarly, the etched back vertical singulation line 202B is disposed along a longitudinal center line of the vertical pre-cut plating line 206B. In this case, the vertical pre-cut plating line 206B includes the opening slot formed using the pre-cut etchback process on opposite side of the vertical pre-cut plating line 206A. Furthermore, the etched back vertical pre-cut plating line 206B includes a length sufficient to traverse or cut across all plating lines 112 along the side of the lead frame 102 where the etched back vertical pre-cut plating line 206B is located.

The foregoing descriptions regarding the etched back vertical singulation lines 202A-202B are similarly applicable to the etched back horizontal pre-cut plating lines 208A-208B. That is, the etched back horizontal pre-cut plating lines 208A-208B include opening slots that are formed on the periphery of the lead frame 102. Each of these opening slots or trenches includes a length sufficient to traverse or cut across all plating lines 112 along the side of the lead frame 102 where the etched back horizontal pre-cut plating lines 208A-208B are correspondingly located.

In an embodiment, the etched vertical pre-cut plating lines 206A-206B and the horizontal pre-cut plating lines 208A-208B above are formed to avoid presence of burrs during a package singulation process. The presence of opening slots or trenches traversing the plating lines 112 prevent the burrs from occurring since the width of the trenches can accommodate the saw blade without the saw blade touching or cutting through the copper materials of the plating lines 112. These opening slots are implemented during the fabrication of the lead frame 102. In other words, prior to the processes of mounting of the chips 104 to the lead frame 102, connecting of the bonding wires 108, and sealing of resins (not shown) prior to the singulation process, the opening slots for the vertical and horizontal singulation lines are pre-fabricated using the pre-cut etchback process on the lead frame 102.

Referencing the depicted cross-section 210 (i.e., cross-section of the top-view), the first chip 104A sits on the first copper mounting area 106A. The cross-section 210 further shows the etched vertical pre-cut plating lines 206A-206B on top surface of the lead frame 102, and vertical pre-cut plating lines 206C and 206D on a bottom surface of the lead frame 102. Furthermore still, the cross-section 210 shows prepreg material 212 that bonds the top and bottom materials (e.g., copper laminated layer) of the lead frame 102. Bonding material 214, such as solder balls are also shown at the bottom of the lead frame 102 to connect the first package (i.e., first chip 104A package) to another package (e.g., singulated second chip 104B package).

In an embodiment, the opening slots defined by the pre-cut plating lines 206A and 206C of the cross-section 210 are aligned with one another. That is, the pre-cut plating line 206A is symmetrical to the pre-cut plating line 206C. Furthermore, each of the pre-cut plating lines 206A and 206C is formed as an elongated tube or cavity etched out from the corresponding top and bottom surfaces of the lead frame 102. In this manner, a cutting plane can be formed along the longitudinal center lines of the pre-cut plating lines 206A and 206C. In other words, the cutting plane extends from a longitudinal center line of the pre-cut plating line 206A to an opposite longitudinal center line of the pre-cut plating line 206C at the bottom lead frame 102. Furthermore, the saw blade that passes through this cutting plane will cut through the prepreg material 212 but will not touch the plating lines 112.

Similarly, the etched opening slots defined by the pre-cut plating lines 206B and 206D are aligned with one another. That is, the pre-cut plating line 206B is symmetrical to the pre-cut plating line 206D. Furthermore, each of the pre-cut plating lines 206B and 206D is formed as an elongated tube or cavity that is etched back from the corresponding top and bottom of the lead frame 102. In this manner, the cutting plane is formed along the longitudinal center lines of the pre-cut plating line 206B and extends to the longitudinal center lines of the pre-cut plating line 206D. Furthermore, the saw blade, which passes through this cutting plane, will cut through the prepreg material 212 without touching the plating lines 112.

In an embodiment, the cross-sectional shapes of the opening slots defined by the pre-cut plating lines 206A to 206D can be elongated "U" shaped tubes or cavities. In another embodiment, the shape of the opening slot can be square shape, or any other shape as long as the etched opening slots allow the singulation blades to cut through the cutting planes without touching or cutting the copper materials of the lead frame 102 and particularly, the plating lines 112. In other words, a trench width (i.e., mouth of the "U" shaped tubes) is wider than a width of the blade to be used during singulation.

As described herein, the prepreg material 212 include glue materials to bond the top copper laminated materials to the bottom copper laminated materials of the lead frame 102. The prepreg material 212 can also include other materials in between to provide mechanical support to the lead frame 102 as further described below.

Figure 3:
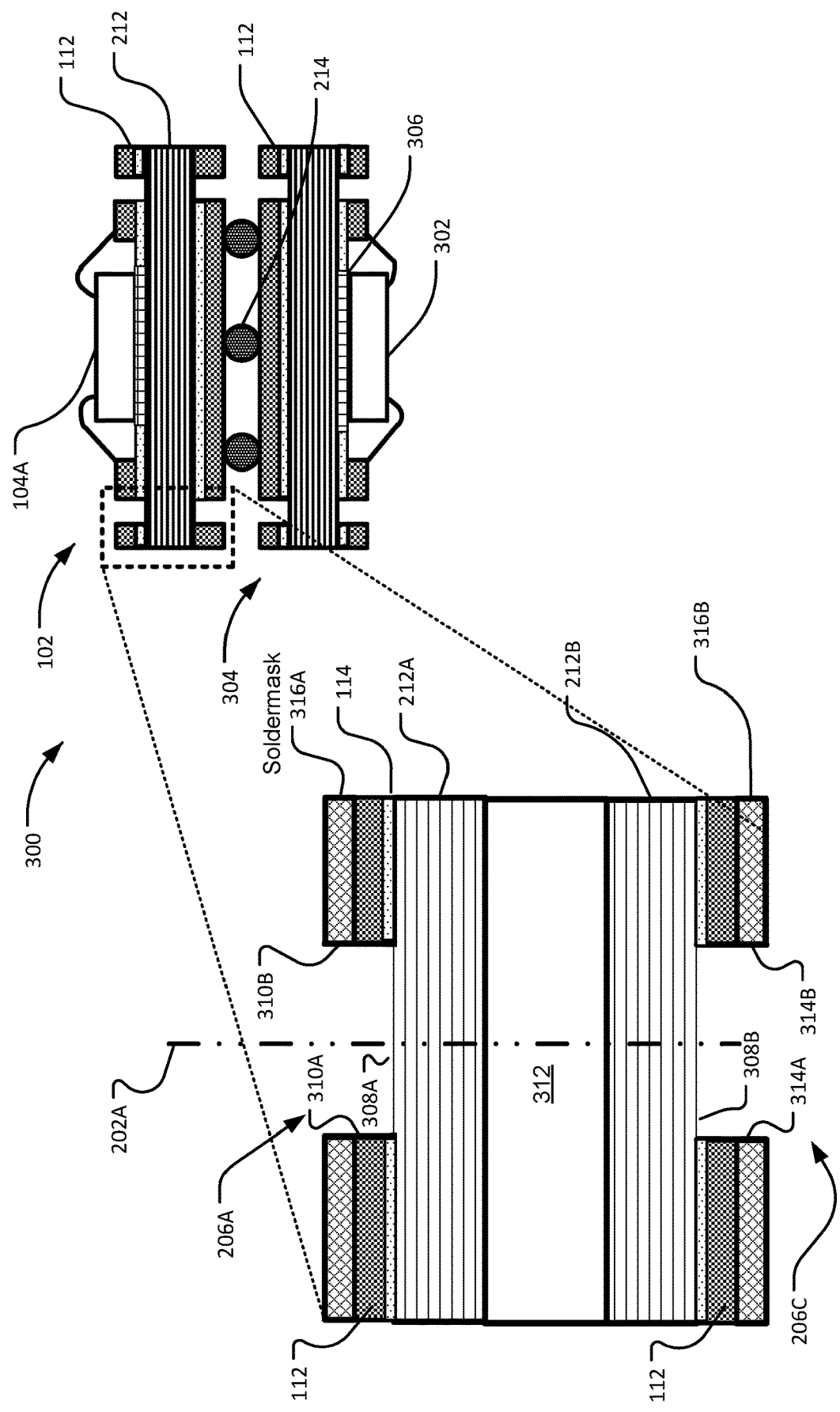
FIG. 3 illustrates an example implementation of a cross-section of a multi-layer semiconductor package to minimize burrs as described herein.

FIG. 3 illustrates an example cross-section 300 of a multi-layer semiconductor package to minimize the burrs as described herein. The multi-layer semiconductor package, for example, includes the first chip 104A mounted on the lead frame 102, and a second chip 302 mounted on the lead frame 304. In this example, the lead frame 304 includes a second copper mounting area 306 for the second lead frame 304. Furthermore, the bonding material 214 such as solder balls or solder bumps physically and/or electrically connects the lead frame 102 to the lead frame 304. Bonding material 214 attaches a backside of the first lead frame 102 to the backside of the second lead frame 304.

As depicted, a portion of the cross-section 300 includes the pre-cut plating line 206A with a trench depth that is enough to expose materials (e.g., glue materials) of the prepreg materials 212A. The trench as shown is bounded by a prepreg surface 308A at the bottom, and trench side walls 310A and 310B as the sides. The cross-section 300 further includes a core material 312 disposed in between the prepreg materials 212A and 212B, and pre-cut plating line 206C. The pre-cut plating line 206C, as shown, is bounded by a prepreg surface 308B at the bottom, and side walls 314A and 314B at the side. The exposed material of the prepreg surface 308B can be glue materials, while the opening slot side walls 314A and 314B can be copper materials. The cross-section 300 further includes a top solder-mask 316A layer and a bottom solder-mask 316B layer.

In an embodiment, the opening slot pre-cut plating line 206A is etched back to a certain depth such that the top surface (i.e., solder mask and copper layer) are totally etched out and the prepreg material 212A is exposed. That is, the pre-etching of the lead frame 102 is performed to form the "U" shape to expose the prepreg surface 308A. In this manner, the singulation blade will pass in between the top sidewalls 310A and 310B, cut through the prepreg material 212A, the core material 312, and the prepreg material 212B; and thereafter exit through and in between the bottom sidewalls 314A and 314B. The vertical singulation line 202A, as shown, illustrates the cutting plane for the singulation blade.

The portion of the cross-section 300 described above similarly apply to other sides of the first lead frame 102 and the second lead frame 304. As depicted, the pre-cut plating lines of the first lead frame 102 is symmetric to the pre-cut plating lines of the second lead frame 304. That is, the opening slots are pre-fabricated along the periphery or edges of the top and bottom surfaces of each of the lead frames 102 and 304.

The core material 312 include materials to implement multi-layered packages. For example, the first chip 104A and the second chip 302 are disposed as a stack. In this example, the core material 312, in combination with the prepreg materials 212A and 212B, can implement the multi-layered semiconductor package as described herein.

Figure 4:
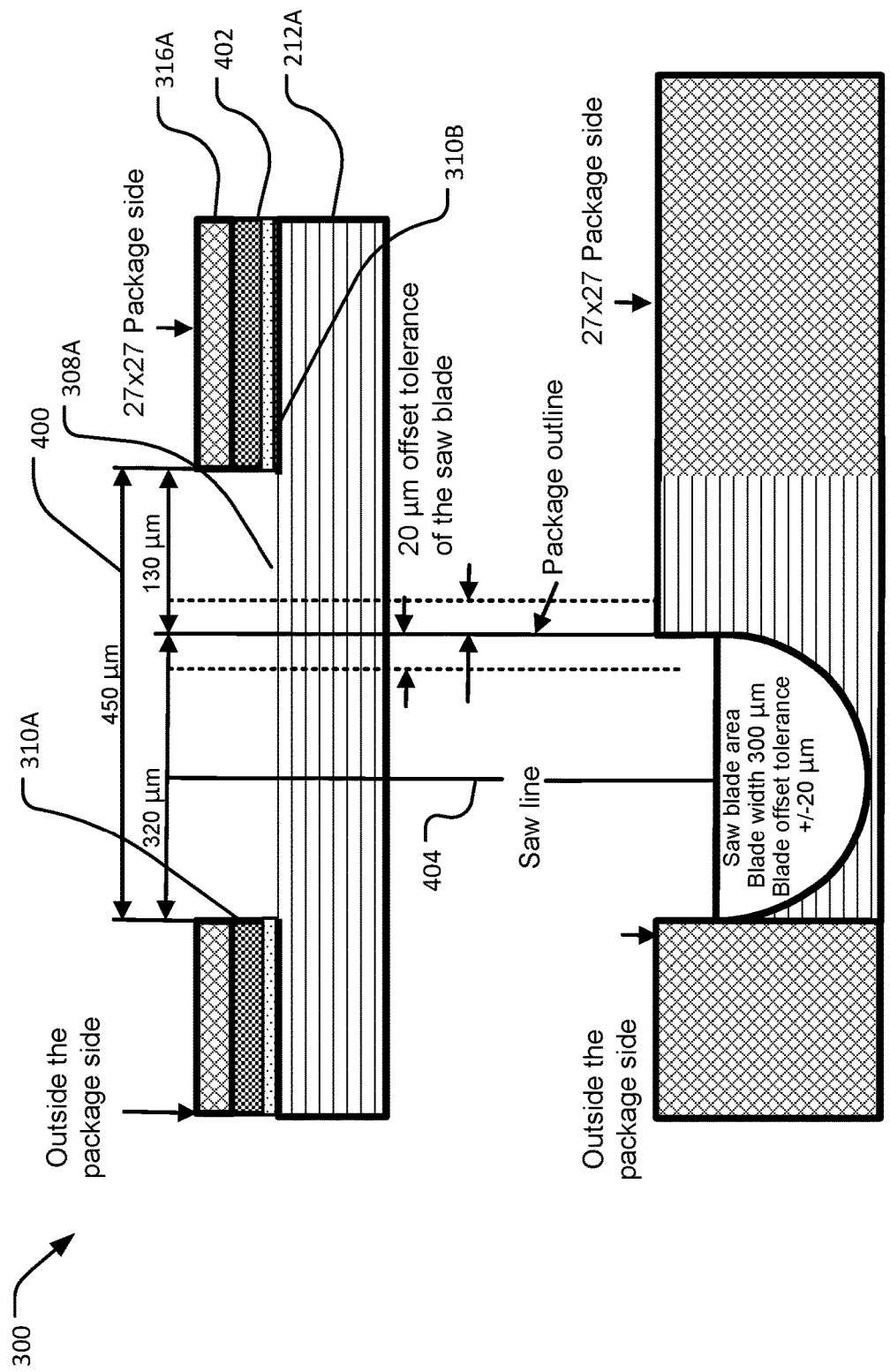
FIG. 4 illustrates an example implementation of the pre-cut plating lines as described herein.

FIG. 4 illustrates an example implementation of the pre-cut plating lines as described herein. Particularly, FIG. 4 shows an example embodiment of the pre-cut plating line 206A formed on top of the lead frame 102.

As shown, the pre-cut plating line 206A can include an opening slot width of about 450 μm, which is measured from the trench sidewall 310A to the trench sidewall 310B. For example, an opening slot 400 is the trench width that includes a distance between the sidewalls 310A and 310B. In this example, the opening slot 400 is also equal to an area of exposed prepreg surface 308A. In other words, the etching or formation of the pre-cut plating line 206A includes removal of the solder mask 316A, a conductive layer 402 (e.g., copper layer), and portions of the insulating material 114 of the lead frame 102.

In an embodiment, the blade for the singulation as described herein in about 300 μm in width. A saw line 404 can include the cutting plane for the singulation blade. The saw line 404 can represent the vertical singulation line 202A above.

For example, the opening slot 400 with a width of 400 μm, the saw line 404 can be located at about 160 μm from the outer sidewall 310A. In this manner, there is a width tolerance at both sides of the sidewalls 310A and 310B in order to avoid burrs at the copper lead. The distance of one side of the blade from the trench sidewall 310A is 10 μm, while another side of the blade has a distance of 140 μm from the other trench sidewall 310B. In this example, the pre-cut plating line 206A will prevent any burrs from occurring in the plating lines 112 of the lead frame 102.

Figure 5:
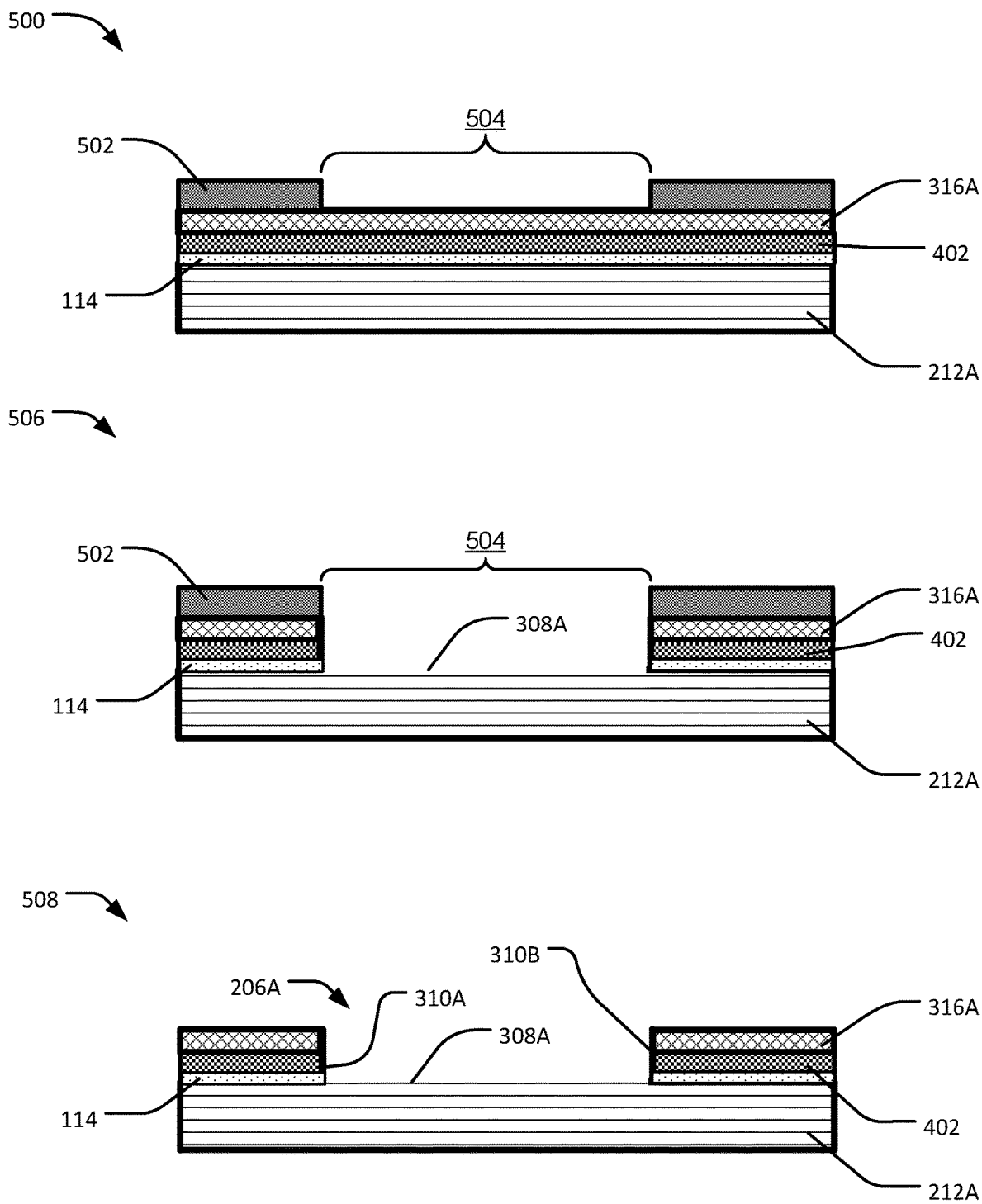
FIG. 5 illustrates an example implementation of pre-fabricating the pre-cut plating lines using pre-cut an etchback process as described herein.

FIG. 5 illustrates an example implementation of pre-fabricating the pre-cut plating lines using the pre-cut etch-back process as described herein. As depicted, step 500 shows formation of a stack using the prepreg material 212A, the conductive layer 402 that is laminated on the insulating material 114, and the solder mask 316A. Furthermore, the step 500 illustrates a masking layer 502 that is patterned on the formed stack and particularly, on a top surface of the solder mask 316A to form a mask opening 504 on the solder mask 316A. The conductive layer 402 is similar to the patterned plating lines 112 on the insulating material 114.

The masking layer 502 can include different materials such as photoresist, silicon nitride, and the like. Furthermore, the masking layer 502 is formed or patterned through a technique of spin-coating, chemical vapor deposition (CVD), low pressure chemical vapor deposition (LPCVD), etc. For example, the masking layer 502 is a layer of photoresist that is formed using traditional photolithography techniques that includes spin-on coating, soft-bake, exposure, hard bake and develop, etc.

In an embodiment, a width and length of the mask opening 504 define the width and length of the pre-cut plating lines as described herein. For example, the width of the mask opening 504 is the same as the width between the trench sidewalls 310A and 310B of FIG. 4. In this example, the mask opening 504 can vary depending upon the application or desires of a device designer.

At step 506, the pre-cut etchback process is performed to remove the layer of solder mask 316A and the conductive layer 402. At step 506, the etching does not apply to portions of the solder mask 316A and the conductive layer 402 covered or protected with the patterned masking layer 502. Furthermore, the pre-cut etchback process is performed to totally etch out the unprotected or exposed solder mask 316A and the conductive layer 402. The exposed solder mask 316A and the conductive layer 402 that is laminated on the insulating material 114 are located within an area defined by the mask opening 504. The total etching of the solder mask 316A, the conductive layer 402 and the insulating material 114 within the mask opening 504 will expose a top surface of the prepreg material 212A. For example, the top surface is the prepreg surface 308A as shown in FIG. 3. In this example, the etching is limited to thickness of the solder mask 316A layer and the conductive layer 402 plus the insulating material 114.

In another embodiment, the pre-cut etchback process further cuts the conductive layer 402 such that the conductive layer 402 is not flushed on the sidewalls 310A and 310B as depicted in FIG. 4. The etched back solder mask 316A and the prepreg surface 308A has the same trench width of about 450 µm. The etched back conductive layer 402 has a trench width of about 475 µm. In other words, the etching back of the conductive layer 402 results to a wider width as compared to the exposed surface of the prepreg material, or to an opening width of the etched solder mask 316A. In this regard, the conductive layer 402 is tucked in compared to protruding solder mask 316A and as such, this etchback process further avoid occurrence of burrs on the conductive layer 402.

At step 508, the patterned masking layer 502 on the lead frame 102 is removed. For example, a commercial chemical such as hydrogen peroxide (H2O2) is dispensed on a surface of the lead frame 102. The materials of the masking layer 502 reacts to the commercial chemical and dissolved. As a result, the pre-cut plating line is formed on the lead frame 102. For example, the formed pre-cut plating line is the pre-cut plating line 206A as described in FIG. 2 above.

In an embodiment, the pre-fabrication of the pre-cut plating lines using the pre-cut etchback process above is applied to top and bottom surfaces of the lead frame 102. Furthermore, the configuration and shape of the etched back pre-cut plating lines can be of different shape and configuration other than the depicted straight lines. For example, the etched back shape includes half sphere, and right angle shapes, etc. In this example, the configuration and shape are implemented such that the etched back opening slot will traverse the plating lines 112 on the lead frame 102.

Figure 6:
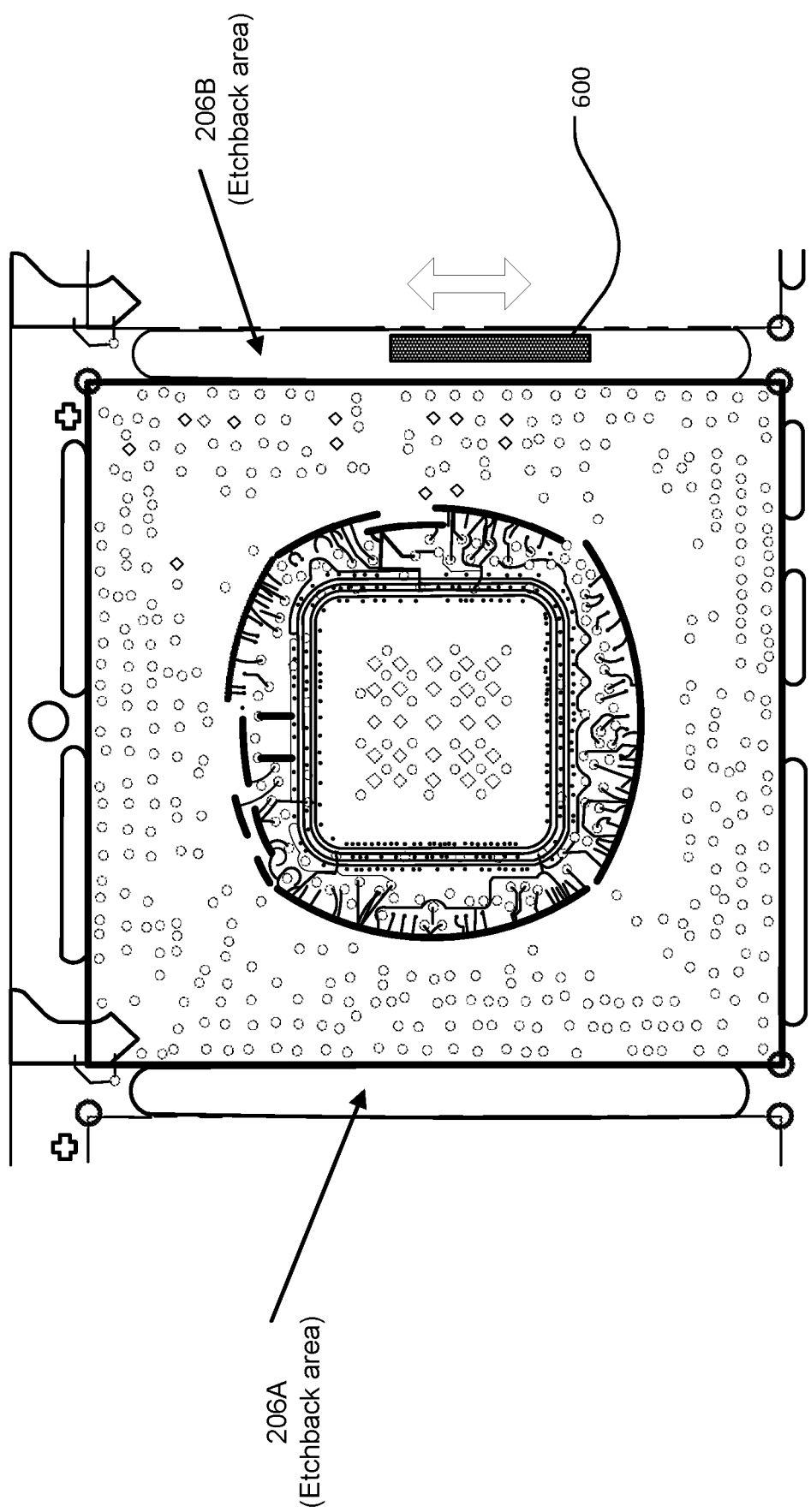
FIG. 6 illustrates an example implementation of chip singulation as described herein.

FIG. 6 illustrates an example implementation of chip singulation as described herein. As shown, a singulation saw blade 600 moves up and down within the etched back opening slot of the pre-cut plating line 206B. In an embodiment, the blade 600 includes a width of about 300 µm, and is aligned to the cutting plane of the pre-cut plating line 206B. In this embodiment, the chip singulation can further use de-flashing processing step in order to remove the prepreg materials that are cut during the process.

As shown, the etched back opening slot width of the pre-cut plating line 206B is wider than the width of the singulation saw blade 600. In this regard, the singulation saw blade 600 does not touch nor cut the lead frame 102 and particularly, the plating lines 112 of the packaging.

Figure 7:
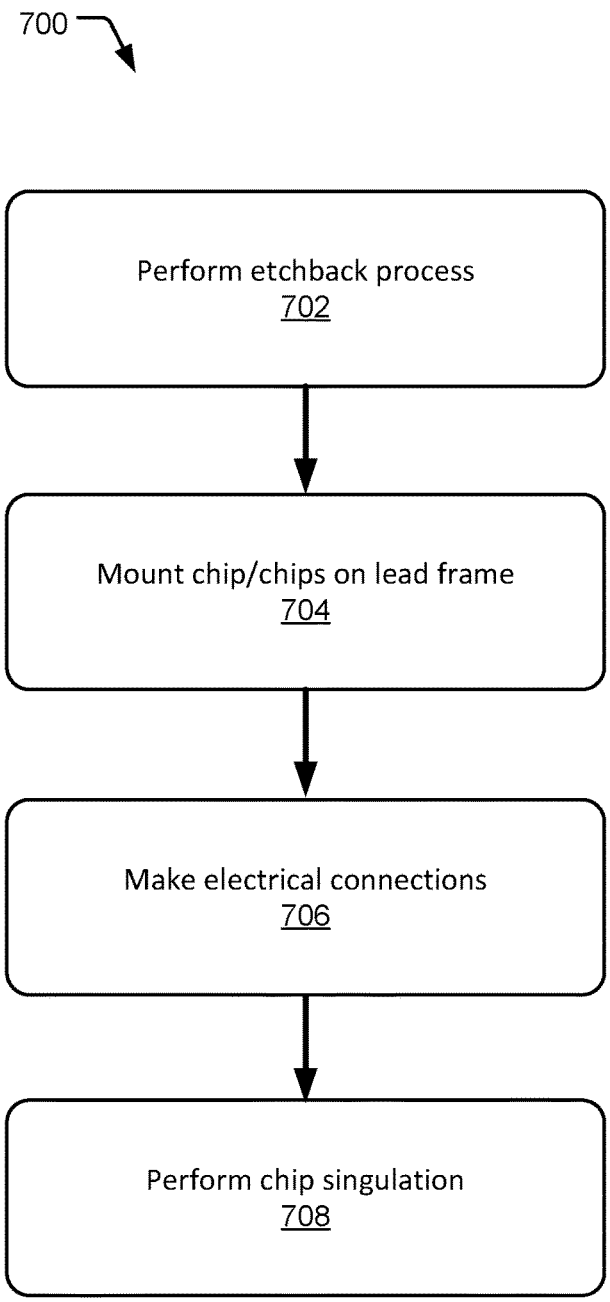
FIG. 7 illustrates an example process chart illustrating an example method for minimizing burrs during singulation of a semiconductor package using etched back pre-cut plating lines as described herein.

FIG. 7 shows an example process chart 700 illustrating an example method for minimizing burrs during singulation of a semiconductor package using etched back pre-cut plating lines as described herein. The order in which the method is described is not intended to be construed as a limitation, and any number of the described method blocks can be combined in any order to implement the method, or alternate method. Additionally, individual blocks may be deleted from the method without departing from the spirit and scope of the subject matter described herein. Furthermore, the method may be implemented in any suitable hardware, software, firmware, or a combination thereof, without departing from the scope of the invention.

At block 702, an etchback process is performed. The etchback process is particularly performed to create pre-cut plating lines. The etch back process is performed by forming a stack of prepreg material 212A, conductive layer 402 that is laminated on the insulating material 114, and solder mask 316A. Patterning the masking layer 502 is then performed on the stack. Forming the mask opening 504 on top of the solder mask 316A is then performed. Thereafter, the exposed or unprotected solder mask 316A and conductive layer 402 within the mask opening 504 are etched back to expose a top surface of the prepreg material 212A. Finally, the patterned masking layer 502 are dissolved with chemicals to produce the pre-cut plating line on 206A on the lead frame 102. In an embodiment, the etched back pre-cut plating lines are formed on each side in between chips, or on different locations of the lead frame 102 depending upon the desired package configurations.

At block 704, mounting a chip or a plurality of chips on the lead frame is performed. For example, the chips 104A and 104B are mounted on the lead frame 102. In this example, the pre-fabricated pre-cut plating lines are formed on each side and in between chips, or on different locations of the lead frame 102 depending upon desired singulation lines.

At block 706, electrical connections from the chip to leads on the lead frame are made. For example, the electrical connections of the bonding wires 108 to leads 110 on lead frame 102.

At block 708, chip singulation on the lead frame is performed. In other words, cutting is performed through the pre-cut plating lines. For example, the first chip 104A is bounded by the vertical pre-cut plating lines 206A-206B and the horizontal pre-cut plating lines 208A-208B. In this example, the vertical singulation lines 202A-202B and the horizontal singulation lines 204A-204B outline the singulation of the lead frame. That is, the saw blade 600 will pass and cut through this outline in order to avoid burrs during the singulation process to individualize the packages.

What is claimed is:

1. A method of forming a semiconductor package comprising:
    an etchback process on a lead frame that comprises:
        forming a stack including a prepreg material, a conductive layer, and a solder mask on a lead frame;
        exposing a top surface of the prepreg material; and
        creating pre-cut plating lines;
    mounting a chip on the lead frame;
    making electrical connections from the chip to leads on the lead frame; and
    cutting through the pre-cut plating lines, wherein an edge of the semiconductor package after cutting, includes a portion of the prepreg material exposed in a slot between an edge of the lead and the edge of the semiconductor package.

2. The method of claim 1, wherein the etchback process further comprises:
    patterning a masking layer on the stack; and
    forming a mask opening on the masking layer.

3. The method of claim 1, wherein creating pre-cut plating lines comprises etching back the solder mask and the conductive layer within the formed mask opening.

4. The method of claim 2, wherein exposing a top surface of the prepreg material comprises dissolving the masking layer.

5. The method of claim 1, wherein the conductive layer includes a copper layer that is laminated on an insulating material.

6. The method of claim 1, wherein each of the pre-fabricated pre-cut plating lines includes a "U" shaped opening slot.

7. The method of claim 6, wherein the opening slot includes a width wider than a width of a saw blade that is used for cutting.

8. The method of claim 5, wherein the conductive layer includes plating lines that extend bonding wires of the electrical connection from the chip.

9. The method of claim 1, wherein each of the pre-fabricated pre-cut plating lines includes the conductive layer etched completely until the top surface of the prepreg material.

10. A method of forming a semiconductor package comprising:
    an etchback process on a lead frame that comprises:
        forming a stack of prepreg material, a conductive layer, and a solder mask;
        patterning a masking layer on the stack;
        forming a mask opening on the masking layer;
        etching back the solder mask and the conductive layer within the formed mask opening to expose a top surface of the prepreg material; and
        dissolving the masking layer, thereby creating pre-cut plating lines;
    mounting a chip on the lead frame;
    making electrical connections from the chip to leads on the lead frame; and
    cutting through the etched back pre-fabricated pre-cut plating lines.

11. The method of claim 10, wherein the conductive layer includes a copper layer that is laminated on an insulating material.

12. The method of claim 10, wherein each of the pre-fabricated pre-cut plating lines includes a "U" shaped opening slot.

13. The method of claim 12, wherein the opening slot includes a width wider than a width of a saw blade that is used for cutting.

14. The method of claim 10, wherein each of the pre-fabricated pre-cut plating lines includes a length that traverses the conductive layer on the lead frame.

15. The method of claim 14, wherein the conductive layer includes plating lines that extend bonding wires of the electrical connection from the chip.

16. The method of claim 10, wherein each of the pre-fabricated pre-cut plating lines includes the conductive layer etched completely until the top surface of the prepreg material.

17. The method of claim 10, wherein each of the pre-fabricated pre-cut plating lines includes a longitudinal opening slot that includes trench sidewalls and a surface of a prepreg material.

* * * * *